United States Patent [19]
Nozaki et al.

[11] Patent Number: 5,910,392
[45] Date of Patent: Jun. 8, 1999

[54] RESIST COMPOSITION, A PROCESS FOR FORMING A RESIST PATTERN AND A PROCESS FOR MANUFACTURING A SEMICONDUCTOR DEVICE

[75] Inventors: Koji Nozaki; Ei Yano; Keiji Watanabe; Takahisa Namiki; Miwa Igarashi, all of Kawasaki, Japan

[73] Assignee: Fujitsu Limited, Kawasaki, Japan

[21] Appl. No.: 08/882,734

[22] Filed: Jun. 26, 1997

[30] Foreign Application Priority Data

Oct. 30, 1996 [JP] Japan .................................. 8-288524

[51] Int. Cl.$^6$ .................................................. G03C 1/492
[52] U.S. Cl. ...................... 430/270.1; 430/910; 430/905; 430/909; 430/325; 430/326
[58] Field of Search ................... 430/270.1, 905, 430/909, 910, 325, 326

[56] References Cited

U.S. PATENT DOCUMENTS

4,491,628  1/1985  Ito et al. .
5,506,088  4/1996  Nozaki et al. ..................... 430/270.1

FOREIGN PATENT DOCUMENTS

5-346668  12/1993  Japan .

OTHER PUBLICATIONS

Yuko Kaimoto et al.; Proc. SPIE—vol. 1672; pp. 66–73; 1992.

Makoto Takahashi et al.; Proc. SPIE—vol. 2438; pp. 422–432; 1995.

Koji Nozaki et al.; Chem. Mater—vol. 6, pp. 1492–1498; 1994.

Koji Nozaki et al.; Jpn. J. Appl. Phys.—vol. 35, pp. L528–L530; 1996.

Koji Nazaki et al.; Journal of Photopolymer Science and Technology; vol. 9, No. 3, pp. 509–522; 1996.

Satoshi Takechi et al.; Journal of Photopolymer Science and Technology, vol. 9, No. 3, pp. 475–488; 1996.

*Primary Examiner*—Janet Baxter
*Assistant Examiner*—Yvette Clarke
*Attorney, Agent, or Firm*—Armstrong, Westerman, Hattori, McLeland & Naughton

[57] ABSTRACT

The present invention discloses a chemically amplified resist composition that is able to form a resist pattern that can be exposed in short wavelength regions, has good transparency, sensitivity, dry-etch resistance and resolution, while also exhibiting excellent adhesion to the substrate. This chemically amplified resist composition comprises: the combination of a base resin comprised of a polymer that is itself insoluble in a basic aqueous solution and contains at least (A) a monomer unit I having carboxylic acid or phenol protected with a specific protective group, and (B) a monomer unit II having an ester group or ether group that contains a cyclic carbonate structure, and can become soluble in a basic aqueous solution when the protective group of the monomer unit I is deprotected by the effect of the acid; and, a photo acid generator capable of generating an acid that can provoke deprotection of the protective group of monomer unit I when decomposed by absorption of imaging radiation.

17 Claims, 2 Drawing Sheets

RESIST COMPOSITION, A PROCESS FOR FORMING A RESIST PATTERN AND A PROCESS FOR MANUFACTURING A SEMICONDUCTOR DEVICE

BACKGROUND OF THE INVENTION

1. Field of the Invention

The present invention relates to a resist composition, and more particularly, a resist composition that can use short wavelength light, such as that from an excimer laser for the imaging radiation, and can be developed by a basic aqueous solution following exposure. In addition, the present invention also relates to a process for forming a positive resist pattern using this resist composition, and a process for manufacturing a semiconductor device that uses the resist pattern formed using the above-mentioned process for the mask.

2. Description of Related Art

LSI and VLSI have come to be used practically in recent years accompanying the process of higher levels of integration of semiconductor integrated circuits, and the minimum line width of the wiring pattern has reached the submicron level. Consequently, it is become essential to establish hyperfine machining technologies. In the field of lithography, as a means of responding to the above requirement, ultraviolet rays as the exposure light source have been changed to far ultraviolet rays having shorter wavelengths, and at the same time, considerable research has been conducted on improvements in the exposure methods using said far ultraviolet rays as the exposure source. Accompanying this research, in the field of resist materials as well, there is a need to develop materials that combine lower absorption of light at shorter wavelengths as described above, have favorable sensitivity and have high tolerance to dry etching.

In view of these circumstances, research has been actively conducted on photolithography using a krypton fluoride excimer laser (wavelength: 248 nm, abbreviated as KrF) as a new type of exposure light source in the manufacturing process of semiconductor devices, and practical application has already begun in some areas. In addition, a resist composition using a concept referred to as chemical amplification has already been proposed by H. Ito, et al. of the IBM Corporation of the USA as a resist having high sensitivity and high resolution and being compatible with such short wavelength light sources (see, for example, J. M. J. Frechet, et al., *Proc. Microcircuit Eng.*, 260 (1982), H. Ito, et al., Digest of Technical Papers of 1982 Symposium on VLSI Technology, 86 (1983), H. Ito, et al., "Polymers in Electronics", ACS Symposium Series 242, T. Davidson ed., ACS, 11 (1984), and U.S. Pat. No. 4,491,628). As can be easily understood from the above-mentioned references, the basic concept of this type of resist composition is to improve the apparent quantum yield by causing a catalytic reaction within the resist film to thereby increase the sensitivity and resolution of the resist composition.

In looking at the example of a chemically amplified, positive resist in which a photo acid generator (PAG), which has the effect of generating acid by light, is added to poly(t-butoxycarbonyloxystyrene) (t-BOCPVP), on which a broad range of research has been conducted thus far, at the exposed portion of the resist, protective groups in the form of t-BOC groups are deprotected by heating after exposure, namely so-called "PEB (post-exposure baking)", resulting in butene and carbon dioxide. The protonic acid formed during deprotection of t-BOC serves as a catalyst which causes the abovementioned protective group deprotection reaction to proceed along the chain, thereby resulting in a considerable change in the polarity of the exposed region. Accordingly, a resist pattern can be formed by selecting an appropriate developing solution that is able to accommodate the large change in polarity of the exposed region.

More recently, an argon fluoride excimer laser (wavelength: 193 nm, abbreviated as ArF) was expected to be used as the exposure light source for manufacturing further advanced high-integration semiconductor devices such as 1 GbitDRAM devices. This laser has a wavelength that is even shorter than the above-mentioned KrF excimer laser. However, in this deep ultraviolet wavelength region, since the aromatic rings contained in resists based on polyvinylphenol (PVP), could be used with KrF lasers, strongly absorb light at the wavelength, a pattern cannot be formed. More specifically, in the case of using, for example, a resist based on polyvinylphenol (PVP), when a fine circuit pattern of 0.2 µm or less is attempted to be formed by ArF lithography, since the aromatic groups in the resist strongly absorb the ArF light during irradiation, the light is unable to reach the bottom of the resist film, thus making it difficult to form the desired resist pattern.

In order to solve the above-mentioned problems, the inventors of the present invention developed a copolymer having an alicyclic hydrocarbon group within its structure, examples of which include adamantylmethacrylate/t-butylmethacrylate copolymer and adamantylmethacrylate/3-oxocyclohexylmethacrylate copolymer, for use as the base resin of a chemically amplified resist, and a patent for said copolymer has already been filed (more specifically, see, for example, Japanese Unexamined Patent Publication (Kokai) No. 5-346668). A resist having this copolymer for its base resin has high transparency at its exposure wavelength and has excellent dry-etch resistance when an ArF laser and so forth is used for the exposure light source. However, due to its highly hydrophobic properties, it has poor adhesion to the substrate underneath, resulting in the separate problem of peeling off from the substrate during alkaline development. Thus, there is currently a pressing need to develop a resist that can be exposed in the deep ultraviolet wavelength region as in the case of an ArF laser, and has good transparency, sensitivity, resistance to dry etching and high resolution, while also exhibiting favorable adhesion to the substrate.

SUMMARY OF THE INVENTION

Thus, in order to solve the technical problems of the prior art as described above, an object of the present invention is to provide a resist composition that can be exposed in the deep ultraviolet wavelength region as in the case of an ArF laser, has good transparency, sensitivity, resistance to dry etching and resolution, while also exhibiting favorable adhesion to the substrate.

In addition, another object of the present invention is to provide a resist composition that allows the use of a basic aqueous solution for the developing solution and is able to form a fine pattern that is free of swelling.

In addition, another object of the present invention is to provide a process for forming a resist pattern using the above-mentioned resist composition.

Moreover, another object of the present invention is to provide a process for manufacturing a semiconductor device using a resist pattern formed by the process of the present invention.

Other objects of the present invention will be easily understood from the detailed explanation provided below.

As a result of earnest research to solve the abovementioned problems, the inventors of the present invention found that a polymer containing at least a monomer unit having a protected carboxylic acid or phenol, and a monomer unit having an ester group or ether group containing a cyclic carbonate portion, is effective as the polymer used for the base resin in a chemically amplified resist composition, thereby leading to completion of the present invention. In particular, the cyclic carbonate portion contained in this polymer is soluble in the developing solution as a result of the ring opening in the development of the resist film in a basic aqueous solution, and has the effect of further enhancing the favorable solubility in the developing solution caused by deprotection of the protective groups from carboxylic acid or phenol. In addition, since the polarity of this cyclic carbonate group is high, it can assure favorable adhesion to the substrate.

In one of its aspects, the present invention is a resist composition that can be developed with a basic aqueous solution comprising: the combination of a base resin comprised of a polymer that is itself insoluble in basic aqueous solution and contains within its structure at least (A) a monomer unit I having carboxylic acid or phenol protected with a protective group capable of being deprotected with an acid selected from the group consisting of an ester group, ether group, acetal group and ketal group, and (B) a monomer unit II having an ester group or ether group that contains a cyclic carbonate structure, and that can become soluble in a basic aqueous solution when the protective group of the above-mentioned monomer unit I is deprotected by the effect of the acid; and, a photo acid generator capable of generating an acid that can provoke deprotection of the above-mentioned protective group of monomer unit I when decomposed by absorption of imaging radiation. Note, hereinafter, the "protective group" is also referred to as the "protecting group".

In addition, in another of its aspects, the present invention is a process for forming a positive resist pattern comprising the following steps: coating the resist composition of the present invention on a substrate to be treated, selectively exposing the formed resist film to imaging radiation which is able to provoke decomposition of the photo acid generator of the above-mentioned resist composition, and developing the exposed resist film with a basic aqueous solution.

In the process for forming a resist pattern according to the present invention, it is preferable to perform heat treatment on the resist film formed on the substrate before and after the selective exposure step. Namely, in the process of the present invention, in addition to pre-baking the resist film prior to exposure, post-baking should be performed as previously explained within the context of PEB (post-exposure baking) after exposure but before development. These heat treatments can be performed advantageously in accordance with routine methods.

Moreover, in yet another of its aspects, the present invention provides a process for manufacturing a semiconductor device comprising the following steps: forming a resist film by coating the resist composition of the present invention on a substrate to be treated, selectively exposing the above-mentioned resist film with imaging radiation which is able to provoke decomposition of the photo acid generator of the above-mentioned resist composition, forming a resist pattern by developing the. exposed resist film with basic aqueous solution, and using the above-mentioned resist pattern as a mask to remove the above-mentioned substrate underneath by etching.

In this process for manufacturing a semiconductor device according to the present invention, the formed resist pattern may, as necessary, be used directly as one element of the semiconductor device, such as an insulating film, instead of being used only as a mask for etching of the substrate underneath.

In the process for forming a resist pattern and process for manufacturing a semiconductor device according to the present invention, although the step of exposing the resist film to imaging radiation can be performed using various exposure light sources corresponding to, for example, the properties of the resist used, in order to maximally demonstrate the properties of the resist, it is preferable to use a light source of a short wavelength region such as a KrF excimer laser or ArF excimer laser.

Use of the resist composition according to the present invention allows the formation of a fine positive resist pattern having high sensitivity without causing swelling. In particular, not only does this resist composition enable deprotection, i.e, elimination of a protecting group such as an ester group that protects a carboxylic acid or phenol in an acid catalyzed reaction, since the dissolution rate of the exposed portion is improved due to the cyclic carbonate structure contained in one monomer unit that composes the base resin in the form of a copolymer reacting with developing solution at the exposed region, it can easily provide higher sensitivity and higher resolution than the chemically amplified resist of the prior art.

In addition, in the case the polymer used as the base resin is a polymer that uses a partner monomer having a phenol and polycyclic aliphatic group, the polymer has a highly increased dry-etch resistance, and if a structure is selected that does not contain conjugated double bonds in a (meth) acrylate polymer, it is compatible with exposure light sources having an extremely short wavelength such as an ArF excimer laser since it does not contain a chromophore having a large absorption coefficient in the deep ultraviolet region.

Moreover, since the resist film formed by using the resist composition of the present invention has extremely favorable adhesion to the substrate underneath, it does not have the problem of peeling off from the substrate during development as occurred in the prior art.

Furthermore, in the manufacturing of a semiconductor device of the present invention, since an effective resist composition such as that described above is used, it is possible to produce devices having smaller gate electrodes and contact holes than the prior art.

DESCRIPTION OF THE PREFERRED EMBODIMENTS

Figure 1A:
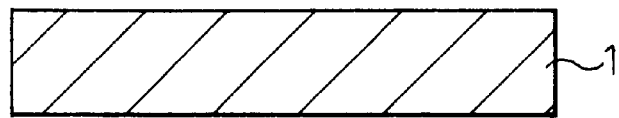
FIGS. 1A, 1B, 1C and 1D are cross-sectional drawings that indicate, in order, one preferable example of the process for forming a resist pattern according to the present invention.

As can be easily understood from the detailed explanation below, the resist composition, process for forming a resist pattern and process for manufacturing a semiconductor device according to the present invention can be carried out in various preferable forms.

The present invention relates to a chemically amplified resist composition that can be developed by a basic aqueous solution in order to form a positive resist pattern on a substrate to be treated. The resist composition of the present invention combines a base resin composed of a film-forming polymer that itself is insoluble in a basic aqueous solution, and a photo acid generator capable of generating an acid as a result of exposure to imaging radiation. Here, the film-forming copolymer used as the base resin, as mentioned above, contains in its structure at least (A) a monomer unit I having a carboxylic acid or phenol protected with a protective group capable of being deprotected with an acid, the protective group being selected from the group consisting of an ester group, ether group, acetal group and ketal group, and (B) a monomer unit II having an ester group or ether group that contains a cyclic carbonate structure; and can become soluble in a basic aqueous solution when the above-mentioned protective group of monomer unit I is deprotected by the effect of the acid.

These film-forming polymers are generally copolymers composed of the above-mentioned monomer units I and II (two-component polymers), or multi-component polymers that combine a third and fourth monomer unit with these monomer units (e.g., terpolymers). When considering obtaining a resistance to dry etching comparable to that of Novolak resist, the monomer units used for composing these copolymers are vinylphenol monomer units, N-substituted maleimide monomer units, styrene monomer units or (meth) acrylate monomer units, namely, acrylate and methacrylate monomer units, having an ester group containing a plurality of or an alicyclic hydrocarbon structure. Particularly suitable monomer units are, for example, (meth)acrylate monomer units in the case of monomer unit I having a protected carboxylic acid, vinylphenol monomer units in the case of monomer unit I having a protected phenol, and (meth) acrylate monomer units in the case of monomer unit II having an ester group or ether group containing a cyclic carbonate structure. (Meth)acrylate monomer units are particularly important with respect to having small absorption of light at the relevant wavelength in the case of using an exposure light source in a short wavelength region. In addition, with. respect to this point, it is preferable to use monomer units that do not contain aromatic rings or chromophores having a large molar absorption coefficient such as conjugated double bonds that strongly absorb light in the short wavelength region.

In addition, there are no particular restrictions on the ester group, the ether group, the acetal group or the ketal group that serves as the protective group of the above-mentioned monomer unit I having a carboxylic acid or phenol provided it has been previously introduced in the literature and so forth. Suitable examples of protective groups are not limited to but include those indicated below.

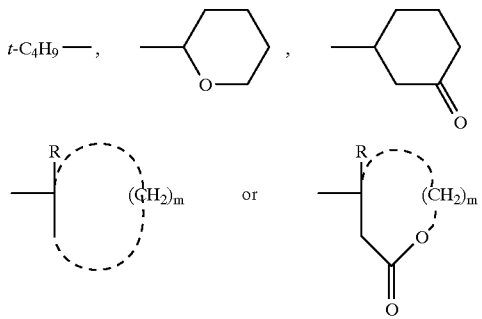

In the above formula, R is an alkyl group having 1–4 carbon atoms such as a methyl group or ethyl group, m is an integer from 4 to 8, and n is an integer from 1 to 3.

In addition, in the case monomer unit I has a phenol, the following groups can also be advantageously introduced as protective groups.

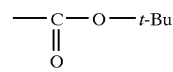

Moreover, in the case of using an ArF excimer laser for the exposure light source, an alicyclic hydrocarbon group is particularly suitable for the protective group of the ester carboxylate. Particularly suitable alicyclic hydrocarbon groups are those having a tertiary alcohol structure and are ester-bonded with that tertiary alcohol. These alicyclic hydrocarbon groups are particularly useful in terms of transparency and dry-etch resistance. As shown in the several examples below, suitable alicyclic hydrocarbon groups include norbornane, adamantane and bicyclo[2,2,2]octane, and others.

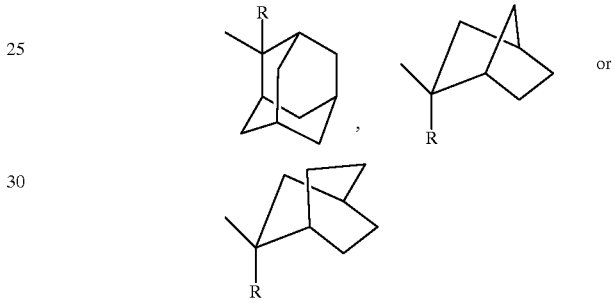

The film-forming polymers that can be advantageously used in the practice of the present invention are, more specifically, not limited to but include the copolymers represented with the following structural formulas (I), (II) and (III). Furthermore, the letters o, p and q in the formulas respectively indicate the number of monomer units (repeating units) required to obtain the abovementioned weight average molecular weights.

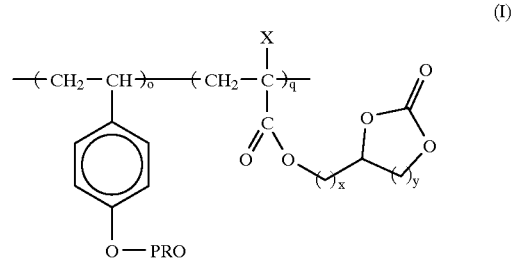

(I)

In the above formulas, unless specified otherwise, X is an optional substitution group such as a hydrogen atom, halogen atom such as chlorine or bromine, lower alkyl group such as a methyl group or ethyl group, —$CO_2$—R (wherein R is an organic group), cyano group or other substitution groups, PRO represents a protective group like the previously indicated typical examples, x is an integer from 1 to 10, and y is an integer from 1 to 3.

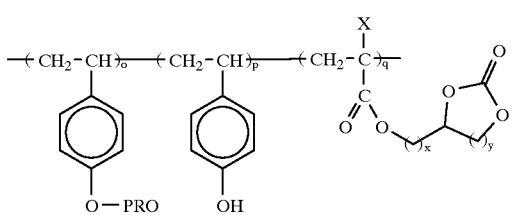

(II)

In the above formulas, X, PRO, x and y are the same as previously defined.

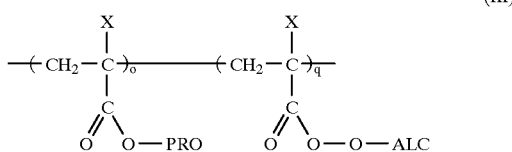

(III)

In the above formulas, ALC is an alicyclic hydrocarbon group and PRO is the same as previously defined. Here, suitable examples of the aliphatic hydrocarbon groups ALC are not limited to, but include the groups indicated below.

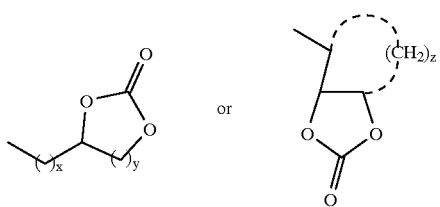

In the above formulas, x and y are the same as previously defined, and z is an integer from 2 to 6.

The molecular weight (weight average molecular weight, Mw) of the (meth)acrylate polymers that can be obtained from the above-mentioned monomer units and advantageously used in the practice of the present invention, as well as other film-forming polymers is preferably within the range of 2,000 to 1,000,000, and more preferably within the range of 5,000 to 50,000, although it is variable over a broad range.

In addition, these (meth)acrylate polymers and other film-forming polymers can respectively be prepared using polymerization methods commonly used in the field of polymer chemistry. For example, although a detailed explanation is omitted in the specification of the present application, the (meth)acrylate polymers of the present invention can be advantageously prepared by free radical polymerization of predetermined monomer components in the presence of a free radical initiator in the form of 2,2'-azobisisobutyronitrile (AIBN).

Similarly, monomer unit II, having an ester group or ether group containing a cyclic carbonate structure, and film-forming polymers containing the same can also be manufactured using general polymerization methods. For example, as is disclosed in (1) W. N. Haworth, et al., J. Chem. Soc., 151 (1930), (2) K. Katsuta, et al., Bull. Chem. Soc. Jpn., 58, 1699 (1985), and (3) R. L. Letsinger, et al., J. Org. Chem., 32, 296 (1967), monomers having a 1,2- or 1,3-diol portion can be synthesized from reagents such as phosgene (1), trichloroacetylchloride (2) or chloro-p-nitrophenoxycarbonate in the presence of a basic compound. In addition, as is disclosed in German Patent No. 3529263 (1987) of G. Brindoepke, monomers having an epoxy group can easily be synthesized by introducing carbon dioxide at normal pressure in the presence of a catalyst such as lithium chloride. The latter method can also be applied to polymer reactions, for example, after copolymerizing a monomer having an epoxy group as exemplified by glycidyl methacrylate with a desired partner in advance, the epoxy group of that copolymer can easily be converted to a 5-membered cyclic carbonate by the above-mentioned technique (see, for example, K. Kihara, et al., Macromol. Chem., 193, 1481 (1992)).

As can be understood from the above-mentioned explanation, the present invention provides a novel resist that uses for its base resin a polymer containing in its structure at least (A) a monomer unit I having carboxylic acid or phenol protected with an ester group, ether group, acetal group or ketal group that can be deprotected by acid catalyst, and (B) a monomer unit II having an ester group or ether group that contains a cyclic carbonate structure. Here, in the case dry-etch resistance (e.g. RIE resistance) is required that is comparable to that of Novolak resist, which is currently used commonly, it is necessary that the content of the phenol monomer unit in the polymer or the alicyclic compound serving as the ester group or ether group is about 50 mol %. In addition, if an alicyclic compound in which the rings are highly bonded is used for the ester group or ether group, it is possible to obtain even greater resistance to dry etching. Moreover, use of the above-mentioned alicyciic or polyalicyclic compound is used is extremely advantageous in terms of transparency at the wavelength of an ArF excimer laser (193 nm) since the structure does not contain conjugated double bonds or aromatic rings showing a strong light absorption.

However, the content in the polymer of the present invention of monomer unit I having a carboxylic acid or phenol that can be deprotected by acid catalyst is preferably 20–80% by weight. If the content of this monomer unit is below 20% by weight, it is not possible to obtain satisfactory development, and in turn, satisfactory patterning. Conversely, if the content exceeds 80% by weight, it becomes soluble in the basic aqueous solution. The content of said monomer unit is more preferably 30–70% by weight.

The polymer serving as the base resin of the present invention may also have a third or fourth monomer unit, such as 2-hydroxyethylmethacrylate or methylmethacrylate in addition to the above-mentioned monomer units I and II provided they do not impair the properties of the resist. Namely, as was previously mentioned, the polymer of the present invention may also be a three-component or four-component copolymer in addition to the above-mentioned two-component copolymer. In the case of using an ArF excimer laser for the exposure light source, instead of a monomer units having phenol or a conjugated double bond, it is preferable to use a (meth)acrylate polymer that is well known to have high transparency in the deep ultraviolet region. In addition, in the case of using the (meth)acrylate polymer, it is preferable that an alicyclic compound is contained in the ester group of that polymer in an amount of 20% by weight to less than 100% by weight, and more preferably 30–70% by weight, in order to improve dry-etch resistance.

In the resist composition of the present invention, the photo acid generator (PAG) used in combination with the film-forming polymer as described above can be a photo acid generator typically used in resist chemistry, namely a substance that generates a protonic acid when irradiated with radiation such as ultraviolet rays, far ultraviolet rays, vacuum ultraviolet rays, electron beam, X-rays or laser light. When carrying out the present invention, suitable photo acid generators include, but are not limited to, those indicated below.

(1) Onium salts represented by the following formulas:

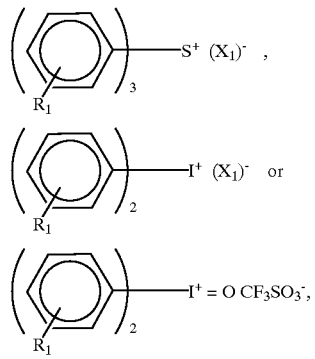

wherein, $R_1$ represents a t-butyl group, alkyl group such as a methyl group, halogen such as chlorine or bromine, or aryl group such as a phenyl group and so forth, and $X_1$ represents $BF_4$, $BF_6$, $PF_6$, $AsF_6$, $SbF6$, $CF_3SO_3$ or $ClO_4$ and so forth.

(2) Sulfonate esters represented by the following formulas:

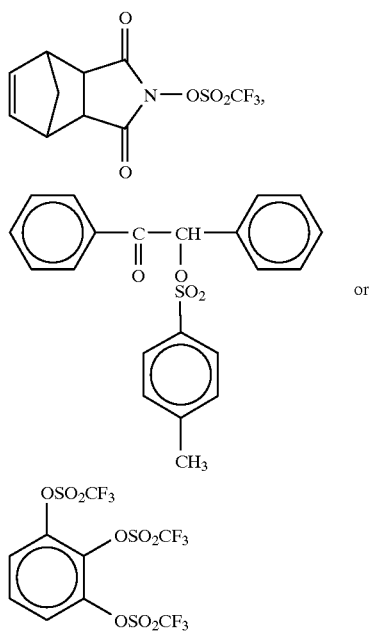

(3) Halides represented by the following formulas:

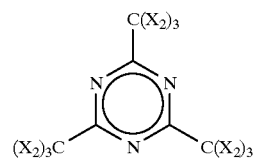

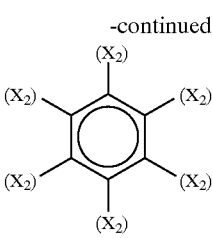

wherein, $X_2$ is a halogen such as Cl, Br or I, provided that one —$CX_2$ group may be a substituted or non-substituted aryl group or alkenyl group.

(4) s-triazine derivatives represented by the following formula:

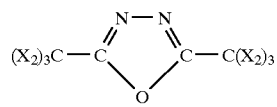

wherein, $X_2$ is the same as previously defined.

(5) disulfone derivatives represented by the following formula:

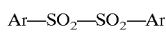

Ar—SO$_2$—SO$_2$—Ar wherein, Ar represents a substituted or unsubstituted aromatic group, such as a phenyl group or a phenyl group substituted with a halogen, methyl group or t-butyl group and so forth or alicyclic group.

(6) Imide compounds represented by the following formulas:

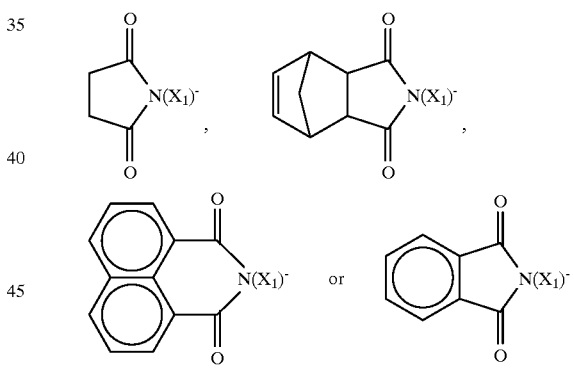

wherein, $X_1$ is the same as previously defined.

These photo acid generators can be used in various amounts in the resist composition of the present invention. According to the findings of the inventors of the present invention, the amount of photo acid generator used is preferably 0.1–50% by weight based on the total amount of film-forming polymer used as the base resin. If the amount of photo acid generator exceeds 50% by weight, light is excessively absorbed which results in patterning being impossible. The amount of photo acid generator used is more preferably 1–15% by weight based on the total amount of polymer.

In addition, in relation to the above, it is preferable to take into consideration the structures of the polymer and photo acid generator as well as the amount of photo acid generator used so that the transmittance at the exposure wavelength of the resist composition of the present invention composed of film-forming polymer and photo acid generator (the value when a resist film having a thickness of 1 μm is formed on a quartz substrate) is at least 20%.

The resist composition of the present invention can normally be advantageously used in the form of a resist solution by dissolving the above-mentioned film-forming polymer and photo acid generator in a suitable organic solvent. Recommended examples of useful organic solvents for preparing a resist solution include, but are not limited to, ethyl lactate, methylamyl ketone, methyl-3-methoxypropionate, ethyl-3-ethoxypropionate and propyleneglycol methyletheracetate. Although these solvents may be used alone, two or more solvents may be mixed and used as necessary. Although there are no particular limitations on the amounts of these solvents used, it is preferable to use an amount that is sufficient for obtaining suitable viscosity and the desired resist film thickness in a coating method such as spin coating, a typical coating method.

In addition to the above-mentioned solvents (referred to as the main solvent in particular), auxiliary solvents may also be used in the resist solution of the present invention as necessary. Although the use of an auxiliary solvent may not be required depending on the solubility of the solute, in the case of using a solute having low solubility, it is normally preferable to add 1–30% by weight of auxiliary solvent, and more preferably 10–20% by weight, relative to the main solvent. Examples of useful auxiliary solvents include, but are not limited to, butyl acetate, γ-butyrolactone and propyleneglycol methylether.

The resist composition according to the present invention can be adequately understood from the abovementioned explanation. Next, the following provides an explanation of the resist composition of the present invention from the aspect of its action.

The major characteristic of the present invention is that, in a polymer used as a base resin, not only are the conventional protective groups of carboxylic acid or phenol that are deprotected by an acid at heating after exposure, but cyclic carbonate rings open in a developing solution composed of a basic aqueous solution, making it soluble in the developing solution. As a result, it is able to simultaneously realize both higher sensitivity and resolution than chemically amplified resists of the prior art, i.e., those described in Kaimoto et al., Proc. SPIE, vol. 1672, 66–73 (1992) in which solubility is altered by deprotection of only one in the monomer components of a copolymer.

In the case of using an ArF excimer laser as the exposure light source, it is preferable to use a (meth)acrylate polymer for the base resin that does not contain conjugated double bonds. Since the alicyclic compounds and cyclic carbonates do not contain chromophores that have a large molar absorption coefficient at wavelengths of 190–250 nm, they can form an acid when decomposed by absorbing a suitable amount of imaging radiation. When combined with a photo acid generator (PAG) that is able to eliminate the above-mentioned ester group, a highly sensitive resist can be realized that can advantageously accommodate exposure using deep ultraviolet rays having a wavelength of 193 nm.

A PAG generates an acid by absorbing imaging radiation. The resulted acid acts as a catalyst to generate the reaction illustrated below in the exposed portion of the resist film as a result of heating. In addition, although the cyclic carbonate in the polymer is generally stable with respect to acid, since the PAG used in combination with that polymer frequently generates an extremely strong acid and heat is added, some cyclic carbonates decarboxylate and change into a diol.

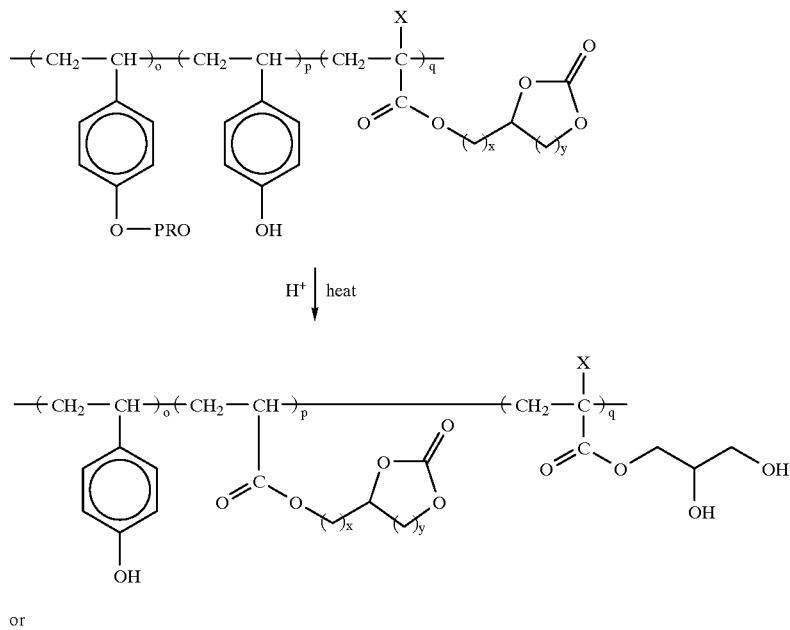

or

-continued

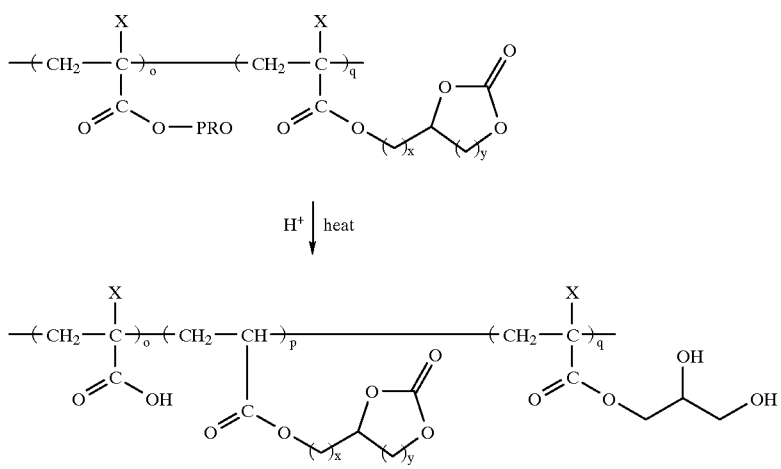

The following reaction continues to occur during the subsequent development by using a basic aqueous solution at the exposed region that has become highly polar due to deprotection of an ester group, thus resulting in further improved development by the basic aqueous solution. At the unexposed regions of the resist film, since the other monomer unit is unreacted, it is strongly hydrophobic which prevents the developing solution from penetrating. Consequently, the following reaction is limited to the only the uppermost surface of the resist film. As a result, there are no detrimental effects such as decreased contrast caused by promotion of dissolution of unexposed regions.

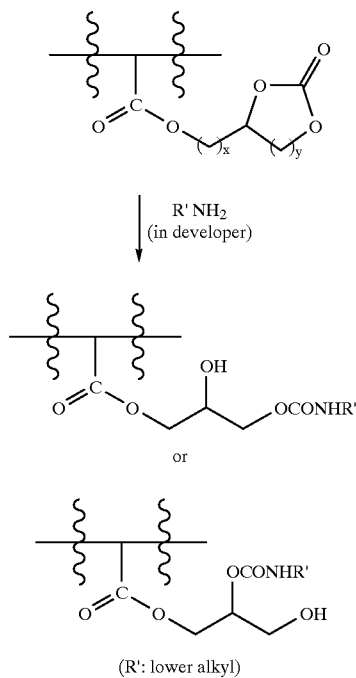

(R': lower alkyl)

In the polymer of the present invention, since a functional group is introduced that can be easily deprotected and thus removed from the carboxylic acid or phenol of the monomer unit by heating in the presence of acid catalyst, protonic acid can be regenerated by that deprotection. Accordingly, a high degree of sensitivity can be achieved. In addition, since carboxylic acid or phenol is regenerated following elimination of the functional group, the exposed region of the resist film becomes soluble in a base, thereby enabling development in a basic aqueous solution. Since the exposed region of the resulted resist pattern is removed by dissolving, the result is a positive pattern. Furthermore, in the present invention, since pattern formation is performed using the change in polarity produced in the polymer, a pattern is obtained that is free from swelling.

The present invention also provides a process for forming a resist pattern, and particularly a positive resist pattern, on a substrate to be treated or fabricated by using the above-mentioned resist composition. The process for forming a resist pattern according to the present invention is characterized by comprising the following steps:

the resist composition of the present invention is coated on a substrate to be treated or fabricated, the formed resist is selectively exposed to imaging radiation that is able to provoke decomposition of a photo acid generator (PAG) of the above-mentioned resist composition, and the exposed resist film is developed with a basic aqueous solution.

The formation of a resist pattern according to the process of the present invention can normally be carried out as described below (see FIGS. 1A through 1D).

Figure 1B:
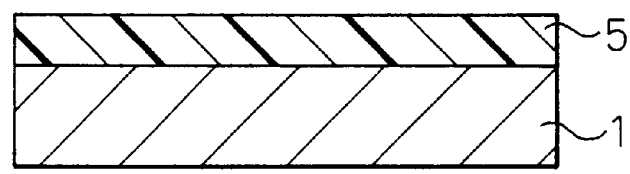

First, after preparing substrate 1 as shown in FIG. 1A, the resist composition of the present invention is coated onto that substrate 1 as shown in FIG. 1B to form resist film 5. The substrate can be a substrate normally used in semiconductor or other devices, several examples of which include a silicon substrate, a glass substrate, a non-magnetic ceramic substrate, a compound semiconductor substrate and an insulated crystal substrate such as alumina. In addition, additional layers, such as a silicon oxide film, a metal wiring layer, an interlayer insulating film or a magnetic film may be present on the substrate as necessary, and various types of wiring and circuits, etc. may be incorporated onto the substrate as well. In the specification of the present application, these additional layers or various types of wiring and circuits, etc. are generically referred to as "layers to be etched" or briefly "etched layer". Specific examples of typical materials of these etched layers include metal silicides such as PSG, TEOS, SiON, TiN, amorphous carbon, Al—Si, Al—Si—Cu and WSi, polysilicon, amorphous silicon, $SiO_2$ and Ga—As. Moreover, the substrate may be hydrophobically in accordance with routine methods to improve adhesion of the resist film to the same. A suitable example of a hydrophobic treatment agent is 1,1,1,3,3,3-hexamethyldisilazane (HMDS).

It is preferable that the coating of the resist composition is performed by coating onto the treated substrate in the form of a resist solution. Although coating of the resist solution can be performed using conventional techniques such as spin coating, roll coating and dip coating, spin coating is particularly useful. Although the thickness of the resist film is recommended to be within the range of approximately 0.1–200 µm, in the case of KrF exposure, a thickness of 0.1–1.5 µm is recommended. Furthermore, the thickness of the formed resist film can be varied over a wide range depending upon factors such as the use of the particular resist film and so forth.

It is preferable that the resist film coated onto the substrate is pre-baked for approximately 60–120 seconds at a temperature of approximately 60–160° C. before selectively exposing to imaging radiation. This pre-baking can be performed using heating means routinely used in the resist process. Examples of suitable heating means include a hot plate, infrared heating oven and microwave heating oven.

Figure 1C:
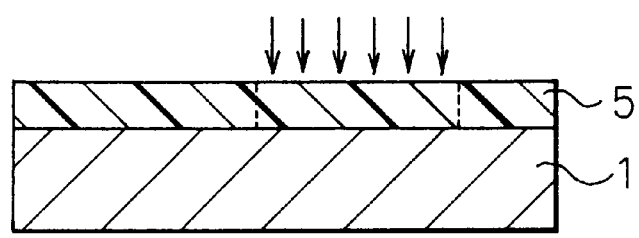

Next, as shown in FIG. 1C, the pre-baked resist film 5 is selectively exposed to imaging radiation with a routinely used exposure device., In the drawing, the exposure radiation is indicated with arrows. Examples of suitable exposure devices include commercially available ultraviolet (far ultraviolet, deep ultraviolet) exposure devices, X-ray exposure devices, electron beam exposure devices and excimer steppers. Exposure conditions can be suitably selected for each type of exposure. In the present invention in particular, excimer lasers (KrF laser having a wavelength of 248 nm and ArF lasers having a wavelength of 193 nm) can be advantageously used as the exposure light source, as was previously described. Furthermore, in the specification of the present application, whenever the term "radiation" is used, it means light from these various light sources, namely ultraviolet rays, far ultraviolet rays, deep ultraviolet rays, electron beam (EB), X-rays, laser light and so forth. As a result of this selective exposure, the dissolution prohibiting compound contained in the exposed region of the resist film absorbs the radiation and decomposes causing said exposed region to become soluble in a basic aqueous solution.

Next, post-exposure baking (PEB) of the exposed resist film causes the protective groups to undergo a deprotection reaction catalyzed by the acid. This post-exposure baking can be performed in the same manner as the previously described pre-baking. For example, the baking temperature is approximately 60–150° C., and preferably approximately 100–150° C.

Figure 1D:
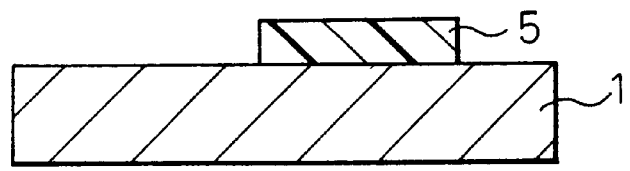

After completion of post-exposure baking, the exposed resist film is developed with a basic aqueous solution as a developing solution. Conventional development devices, such as a spin developer, dip developer or spray developer can be used for this development. Here, the basic aqueous solution that can be advantageously used for the developing solution is an aqueous solution of the hydroxide of a metal belonging to group I or II of the periodic table as represented by potassium hydroxide, or an aqueous solution of an organic base not containing metal ion such as tetraalkylammonium hydroxide. More preferably, the basic aqueous solution is an aqueous solution of tetramethylammonium hydroxide (TMAH), tetraethylammonium hydroxide (TEAH) and so forth. In addition, said basic aqueous solution may contain additives such as a surface active agent to improve its developing effects. As a result of development, the exposed region of the resist film is dissolved and removed as shown in FIG. 1D, resulting in only the non-exposed region remaining on substrate 1 in the form of resist pattern 5.

The present invention also provides a process for manufacturing a semiconductor device by using, as the mask, the resist pattern formed in the manner described above. The process for manufacturing a semiconductor device according to the present invention is characterized by comprising the following steps:

the resist composition of the present invention is coated onto a substrate to be treated or fabricated to form a resist film, the above-mentioned resist film is selectively exposed to imaging radiation able to provoke decomposition of a photo acid generator (PAG) of the above-mentioned resist composition, the exposed resist film is developed with a basic aqueous solution to form a resist pattern, and the substrate underneath is removed by etching using the above-mentioned resist pattern as a mask.

In this process, the steps of forming the resist film, selective exposure to radiation, and forming the resist pattern can be advantageously carried out in accordance with the techniques explained with reference to FIGS. 1A through 1D.

In addition, the subsequent etching process can be performed by wet etching or dry etching, but preferably dry etching. As is commonly known, dry etching involves etching a substrate in a vapor phase. Suitable examples of dry etching including plasma etching such as reactive ion etching (RIE), reactive ion beam etching (RIBE) and ion beam etching. This dry etching can be performed under predetermined conditions using a commercially available etching device.

In addition, although the resist pattern formed according to the process of the present invention can normally be advantageously used as a mask for etching of a substrate present underneath, that resist pattern may also be used as one element of a semiconductor device, such as an insulating film, provided it is able to satisfy predetermined requirements relating to characteristics and so forth.

Here, there are no particular limitations on the "semiconductor device", and it indicates an ordinary semiconductor main circuit or other related device such as an IC, LSI or VLSI as is recognized to be typical in this technical field. To specify even further, the semiconductor device of the present invention is a semiconductor device on which can be performed high-integration or hyperfine machining, or in other words, has a pattern rule of 2 µm or less. An example of this type of semiconductor device includes, but is not limited to, an MOS transistor.

Manufacturing of a semiconductor device according to the process of the present invention can be performed, in one example, as shown in FIGS. 2A through 2F. Furthermore, the example illustrated in the drawings is that of manufacturing a MOS transistor.

Figure 2A:
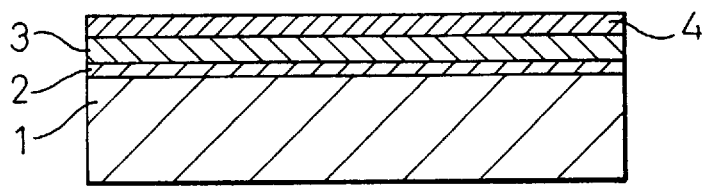
FIGS. 2A, 2B, 2C, 2D, 2E and 2F are cross-sectional drawings that indicate, in order, one preferable example of the process for manufacturing a semiconductor device according to the present invention.

First, as shown in FIG. 2A, gate oxide film 2, polysilicon film 3 and WSi film 4 are sequentially formed on silicon substrate 1. Formation of each of these thin films can be performed by thermal oxidation, chemical vapor deposition (CVD) or other methods as is routinely performed in this technical field.

Figure 2B:
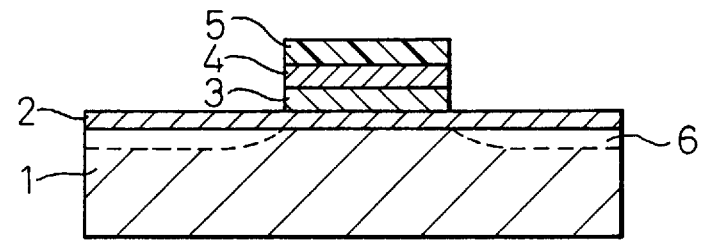

Next, the resist composition according to the present invention is coated onto the uppermost layer in the form of the WSi film to form the resist film. This resist film is selectively irradiated with radiation such as excimer laser light that is suited to that patterning, and then developed in a basic aqueous solution. Dry etching is then performed on the polysilicon film and the WSi film underneath using the resulting resist pattern as a mask. After formation of the gate electrode comprised of the polysilicon film and WSi film, ions are injected by ion implantation to form an N- diffusion layer having an LDD structure. A gate electrode structure like that shown in FIG. 2B is obtained by going through this series of steps. In the drawing, reference numeral 5 indicates a resist film (used as a mask), while reference numeral 6 indicates an N⁻ diffusion layer.

Figure 2C:
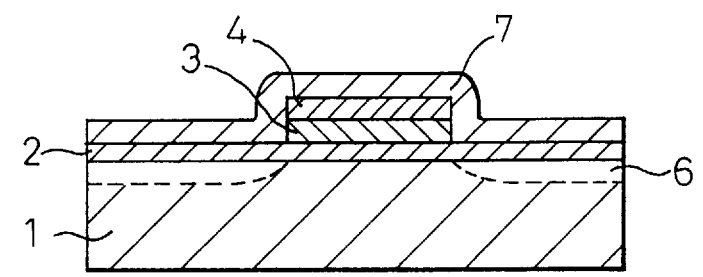
Figure 2D:
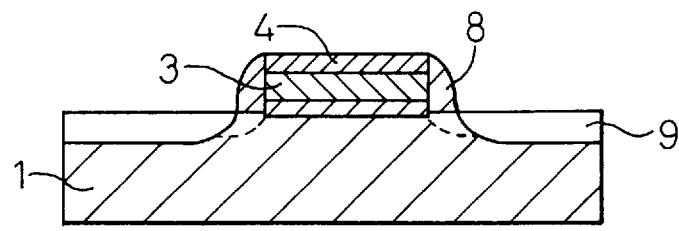
Figure 2E:
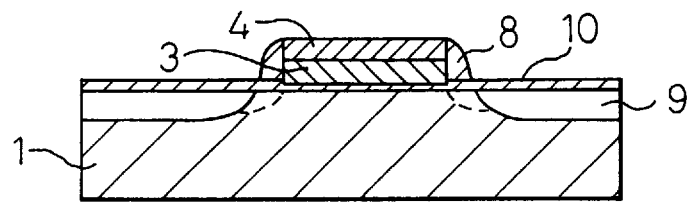

After removal of the resist film on the gate electrode, oxide film 7 is formed over the entire surface by CVD as shown in FIG. 2C. Anisotropic etching is performed on the formed CVD oxide film 7 as shown in FIG. 2D to form side wall 8 on the side wall of the gate electrode comprising polysilicon film 3 and WSi film 4. Moreover, ion implantation is performed using WSi film 4 and side wall 8 as masks to form N⁺ diffusion layer 9. Continuing, the gate electrode is covered with thermal oxide film 10 as shown in FIG. 2E.

Figure 2F:
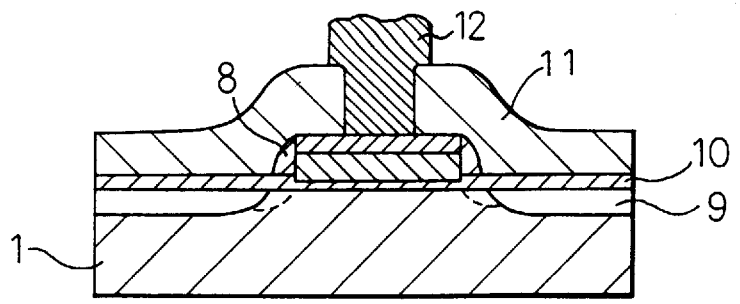

Finally, an interlayer insulating film is formed over the entire surface of the uppermost layer of the substrate by CVD after which selective etching is performed by re-coating the resist composition of the present invention to form a hole pattern in the wiring forming area. Moreover, the interlayer insulating layer underneath is etched using this resist pattern as the mask to open a contact hole. Aluminum (Al) wiring is then embedded in this contact hole to complete a hyperfine, N-channel MOS transistor as shown in FIG. 2F. In the drawing, reference numeral 11 indicates an interlayer insulating film, while reference numeral 12 indicates aluminum wiring.

EXAMPLES

Next, the following provides an explanation of the present invention with respect to synthesis of the film-forming polymer used as a base resin, preparation of the resist composition, formation of the resist pattern, and manufacturing of a semiconductor device. Furthermore, the following indicate only a few examples of the present invention, and it should be understood that the scope of the present invention is in no way limited by these examples.

Example 1

Synthesis of 4-t-butoxycarbonyloxystyrene/4-vinylphenol/propylenecarbonatemethacrylate copolymer 7.82 g (63 millimoles) of vinylphenol, 4.69 g (33 millimoles) of glycidylmethacrylate, a Teflon™-coated stirring bar, 33 ml of dioxane and 2.44 g (14.9 millimoles) of azobisisobutyronitrile (AIBN) were added to a 100 ml eggplant type flask and stirred for 8 hours at 70° C. in a nitrogen atmosphere. After diluting the reaction solution with tetrahydrofuran (THF), it was dropped in 1.5 liters of ether containing a small amount of hydroquinone. The resulted precipitate was filtered off with a glass filter and dried for 16 hours at 0.1 mmHg and 45° C. The resulted white powder was again dissolved in THF and the above-mentioned precipitation and drying procedure was repeated twice to obtain a white resin powder.

Next, the resulted white resin powder was placed in a 100 ml three-necked flask. After placing a Teflon™-coated stirring bar in the flask and attaching a Dimroth condenser and carbon dioxide feed tube, the powder was dissolved in 100 ml of N-methylpyrrolidone (NMP). The mixture was stirred for 3 hours at 100° C. while introducing carbon dioxide by vaporizing dry ice. The reaction mixture was dropped into 1.5 liters of a water-ethanol mixture (1:1). The resulted precipitate was filtered off with a glass filter and dried for 16 hours at 0.1 mmHg and 45° C. The resulted white powder was dissolved in THF, and the above-mentioned precipitation and drying procedure was repeated twice to obtain 10.2 g of a white resin powder. When the composition of this white powder was examined by ¹H-NMR, the ratio of phenol to methacrylate was determined to be 70:30.

Continuing, the resulted white powder was placed in a 100 ml eggplant type flask to which was then added a Teflon™-coated stirring bar and 100 ml of dioxane. 1.68 (15 millimoles) of potassium t-butyldicarbonate were added in a nitrogen atmosphere and stirred for 4 hours at 0° C. 3 g (13.9 millimoles) of di-t-butyldicarbonate were then added followed by additionally stirring for 3 hours at 0° C. After concentrating the reaction solution, it was dropped in 1.5 liters of methanol resulting in precipitation. The formed precipitate was filtered off with a glass filter and dried for 16 hours at 0.1 mmHg and 45° C. The resulted white powder was dissolved in THF, and the above-mentioned precipitation and drying procedure was repeated twice to obtain a white resin powder. When the composition of this white powder was examined by ¹H-NMR, the ratio of phenol to butoxycarbonylphenol to methacrylate in the copolymer was determined to be 31:39:30. The transmittance of this copolymer at a wavelength of 248 nm was 60% (film thickness: 1 μm, on a quartz substrate), thus indicating excellent transparency. In addition, other analysis results were as shown below.

Yield: 8 g (63.9%)

Weight average molecular weight: 17800 (based on standard polystyrene)

Degree of dispersion: 1.78

IR (KRS-5, cm⁻¹) : 3500, 1815, 1160, 1103

Example 2

Synthesis of tetrahydropyranylmethacrylate/propylenecarbonatemethacrylate copolymer 5 g (29.4 millimoles) of tetrahydropyranylmethacrylate, 4.17 g (29.4 millimoles) of glycidylmethacrylate, a Teflon™-coated stirring bar, 19.6 ml of dioxane and 1.45 g (8.8 millimoles) of azobisisobutyronitrile (AIBN) were added to a 100 ml eggplant type flask and stirred for 8 hours at 70° C. in a nitrogen atmosphere. After diluting the reaction solution with tetrahydrofuran (THF), it was dropped in 1.5 liters of methanol containing a small amount of hydroquinone. The resulting precipitate was filtered off with a glass filter and dried for 16 hours at 0.1 mmHg and 45° C. The resulted white powder was again dissolved in THF and the above-mentioned precipitation and drying procedure was repeated twice to obtain a white resin powder.

Next, the resulted white resin powder was placed in a 100 ml three-necked flask. After placing a Teflon™-coated stirring bar in the flask and attaching a Dimroth condenser and carbon dioxide feed tube, the powder was dissolved in 100 ml of NMP. The mixture was stirred for 3 hours at 100° C. while introducing carbon dioxide by vaporizing dry ice. The reaction mixture was dropped into 1.5 liters of methanol. The resulted precipitate was filtered off with a glass filter and dried for 16 hours at 0.1 mmHg and 45° C. The resulted white powder was dissolved in THF, and the above-mentioned precipitation and drying procedure was repeated twice to obtain a white resin powder. When the composition of this white powder was examined by $^1$H-NMR, the ratio of tetrahydropyranyl to carbonate in the copolymer was determined to be 49:51. The transmittances of this copolymer at wavelengths of 248 and 193 nm were 96% and 64%, respectively (film thickness: 1 μm, on a quartz substrate), thus indicating excellent transparency. In addition, other analysis results were as shown below.

Yield: 7.03 g (76.7%)

Weight average molecular weight: 13900 (based on standard polystyrene)

Degree of dispersion: 1.75

IR (KRS-5, cm$^{-1}$): 1812, 1724, 1259, 1161, 1103

Example 3

Synthesis of 2-methyl-2adamantylmethacrylate/ propylenecarbonatemethacrylate copolymer 7.15 g (29.4 millimoles) of 2-methyl-2-adamantylmethacrylate, 4.17 g (29.4 millimoles) of glycidylmethacrylate, a Teflon™-coated stirring bar, 19.6 ml of dioxane and 1.45 g (8.8 millimoles) of azobisisobutyronitrile (AIBN) were added to a 100 ml eggplant type flask and stirred for 8 hours at 70° C. in a nitrogen atmosphere. After diluting the reaction solution with tetrahydrofuran (THF), it was dropped into 1.5 liters of methanol containing a small amount of hydroquinone. The resulted precipitate was filtered off with a glass filter and dried for 16 hours at 0.1 mmHg and 45° C. The resulted white powder was again dissolved in THF and the above-mentioned precipitation and drying procedure was repeated twice to obtain a white resin powder.

Next, the resulted white resin powder was placed in a 100 ml three-necked flask. After placing a Teflon™-coated stirring bar in the flask and attaching a Dimroth condenser and carbon dioxide feed tube, the powder was dissolved in 100 ml NMP. The mixture was stirred for 3 hours at 100° C. while introducing carbon dioxide by vaporizing dry ice. The reaction mixture was dropped into 1.5 liters of methanol. The resulted precipitate was filtered off with a glass filter and dried for 16 hours at 0.1 mmHg and 45° C. The resulted white powder was dissolved in THF, and the above-mentioned precipitation and drying procedure was repeated twice to obtain a white resin powder. When the composition of this white powder was examined by $^1$H-NMR, the ratio of adamantyl to carbonate in this copolymer was determined to be 52:48. The transmittances of this copolymer at wavelengths of 248 and 193 nm were 96% and 63%, respectively (film thickness: 1 μm, on a quartz substrate), thus indicating excellent transparency. In addition, other analysis results were as shown below.

Yield: 7.92 g (70%)

Weight average molecular weight: 18500 (based on standard polystyrene)

Degree of dispersion: 1.75

IR (KRS-5, cm$^{-1}$) : 1814, 1731, 1259, 1157, 1101

Example 4

Synthesis of 3-oxocyclohexylmethacrylate/ propylenecarbonatemethacrylate copolymer 5.35 g (29.4 millimoles) of 3-oxocyclohexylmethacrylate, 4.17 g (29.4 millimoles) of glycidylmethacrylate, a Teflon™-coated stirring bar, 19.6 ml of dioxane and 1.45 g (8.8 millimoles) of azobisisobutyronitrile (AIBN) were added to a 100 ml eggplant type flask and stirred for 8 hours at 70° C. in a nitrogen atmosphere. After diluting the reaction solution with tetrahydrofuran (THF), it was dropped into 1.5 liters of methanol containing a small amount of hydroquinone. The resulted precipitate was filtered off with a glass filter and dried for 16 hours at 0.1 mmHg and 45° C. The resulted white powder was again dissolved in THF and the above-mentioned precipitation and drying procedure was repeated twice to obtain a white resin powder.

Next, the resulted white resin powder was placed in a 100 ml three-necked flask. After placing a Teflon™-coated stirring bar in the flask and attaching a Dimroth condenser and carbon dioxide feed tube, the powder was dissolved in 100 ml NMP. The mixture was stirred for 3 hours at 100° C. while introducing carbon dioxide by vaporizing dry ice. The reaction mixture was dropped into 1.5 liters of methanol. The resulted precipitate was filtered off with a glass filter and dried for 16 hours at 0.1 mmHg and 45° C. The resulted white powder was dissolved in THF, and the above-mentioned precipitation and drying procedure was repeated twice to obtain a white resin powder. When the composition of this white powder was examined by $^1$H-NMR, the ratio of oxocyclohexyl to carbonate in this copolymer was determined to be 49:51. The transmittances of this copolymer at wavelengths of 248 and 193 nm were 96% and 65%, respectively (film thickness: 1 μm, on a quartz substrate), thus indicating excellent transparency. In addition, other analysis results were as shown below.

Yield: 6.28 g (66%)

Weight average molecular weight: 14200 (based on standard polystyrene)

Degree of dispersion: 1.68

IR (KRS-5, cm$^{-1}$) : 1814, 1730, 1262, 1160, 1103

Example 5

Synthesis of mevaloniclactonemethacrylate/ propylenecarbonatemethacrylate copolymer 5.82 g (29.4 millimoles) of mevaloniclactonemethacrylate, 4.17 g (29.4 millimoles) of glycidylmethacrylate, a Teflon™-coated stirring bar, 19.6 ml of dioxane and 1.45 g (8.8 millimoles) of azobisisobutyronitrile (AIBN) were added to a 100 ml eggplant type flask and stirred for 8 hours at 70° C. in a nitrogen atmosphere. After diluting the reaction solution with tetrahydrofuran (THF), it was dropped into 1.5 liters of methanol containing a small amount of hydroquinone. The resulted precipitate was filtered off with a glass filter and dried for 16 hours at 0.1 mmHg and 45° C. The resulted white powder was again dissolved in THF and the above-mentioned precipitation and drying procedure was repeated twice to obtain a white resin powder.

Next, the resulted white resin powder was placed in a 100 ml three-necked flask. After placing a Teflon™-coated stirring bar in the flask and attaching a Dimroth condenser and carbon dioxide feed tube, the powder was dissolved in 100 ml NMP. The mixture was stirred for 3 hours at 100° C. while introducing carbon dioxide by vaporizing dry ice. The reaction mixture was dropped into 1.5 liters of methanol. The resulted precipitate was filtered off with a glass filter and dried for 16 hours at 0.1 mmHg and 45° C. The resulted white powder was dissolved in THF, and the above-mentioned precipitation and drying procedure was repeated twice to obtain a white resin powder. When the composition of this white powder was examined by $^1$H-NMR, the ratio of lactone to carbonate in this copolymer was determined to be 49:51. The transmittances of this copolymer at wavelengths of 248 and 193 nm were 96% and 65%, respectively (film thickness: 1 μm, on a quartz substrate), thus indicating excellent transparency. In addition, other analysis results were as shown below.

Yield: 6.79 g (68%)

Weight average molecular weight: 16500 (based on standard polystyrene)

Degree of dispersion: 1.75

IR (KRS-5, $cm^{-1}$) : 1814, 1738, 1260, 1160, 1107

Example 6

Synthesis of mevaloniclactonemethacrylate/2,3-cyclohexanecarbonatemethacrylate copolymer 5.82 g (29.4 millimoles) of mevaloniclactonemethacrylate, 5.35 g (29.4 millimoles) of 2,3-cyclohexanecarbonatemethacrylate, a Teflon™-coated stirring bar, 19.6 ml of dioxane and 1.45 g (8.8 millimoles) of azobisisobutyronitrile (AIBN) were added to a 100 ml eggplant type flask and stirred for 8 hours at 70° C. in a nitrogen atmosphere. After diluting the reaction solution with tetrahydrofuran (THF), it was dropped into 1.5 liters of methanol containing a small amount of hydroquinone. The resulted precipitate was filtered off with a glass filter and dried for 16 hours at 0.1 mmHg and 45° C. The resulted white powder was again dissolved in THF and the above-mentioned precipitation and drying procedure was repeated twice to obtain a white resin powder.

Next, the resulted white resin powder was placed in a 100 ml three-necked flask. After placing a Teflon™-coated stirring bar in the flask and attaching a Dimroth condenser and carbon dioxide feed tube, the powder was dissolved in 100 ml NMP. The mixture was stirred for 3 hours at 100° C. while introducing carbon dioxide by vaporizing dry ice. The reaction mixture was dropped into 1.5 liters of methanol. The resulted precipitate was filtered off with a glass filter and dried for 16 hours at 0.1 mmHg and 45° C. The resulted white powder was dissolved in THE, and the above-mentioned precipitation and drying procedure was repeated twice to obtain a white resin powder. When the composition of this white powder was examined by $^1$H-NMR, the ratio of lactone to carbonate in this copolymer was determined to be 50:50. The transmittances of this copolymer at wavelengths of 248 and 193 nm were 96% and 65%, respectively (film thickness: 1 μm, on a quartz substrate), thus indicating excellent transparency. In addition, other analysis results were as shown below.

Yield: 7.96 g (70%)

Weight average molecular weight: 18100 (based on standard polystyrene)

Degree of dispersion: 1.81

IR (KRS-5, $cm^{-1}$) : 1815, 1730, 1260, 1160, 1103

Example 7

Formation of Resist Pattern

The copolymer synthesized in the above-mentioned Example 1 was dissolved in propyleneglycol methylether acetate to prepare a 19% by weight solution. Furthermore, this copolymer solution also contained 8% by weight of γ-butyrolactone as an auxiliary solvent. 5% by weight relative to the copolymer of triphenylsulfonium trifluoromethane sulfonate was added to the resulting solution and completely dissolved. After filtering the resulting resist solution with a 0.2 μm Teflon™ membrane filter, it was spin coated onto a silicon substrate treated with HMDS at 3000 rpm and pre-baked for 60 seconds at 120° C. to obtain a resist film having a thickness of 0.7 μm. After exposing this resist film with a KrF excimer laser stepper (NA=0.45), it was baked for 90 seconds at 100° C., developed with a 2.38% aqueous solution of tetramethylammonium hydroxide (TMAH), and rinsed for 60 seconds with deionized water. The film was able to resolve a 0.25 μm line-and-space (L/S) pattern at an exposure dose of 16.4 mJ/$cm^2$.

Example 8

Formation of Resist Pattern

The copolymer synthesized in the above-mentioned Example 2 was dissolved in ethyl lactate to prepare a 16% by weight solution. 5% by weight relative to the copolymer of triphenylsulfonium trifluoromethane sulfonate was added to the resulting ethyl lactate solution and completely dissolved. After filtering the resulting resist solution with a 0.2 μm Teflon™ membrane filter, it was spin coated onto a silicon substrate treated with HMDS at 3000 rpm and pre-baked for 60 seconds at 120° C. to obtain a resist film having a thickness of 0.7 μm. After exposing this resist film with a KrF excimer laser stepper (NA=0.45), it was baked for 60 seconds at 120° C., developed with a 2.38% aqueous solution of tetramethylammonium hydroxide (TMAH), and rinsed for 60 seconds with deionized water. The film was able to resolve a 0.25 μm line-and-space (L/S) pattern at an exposure dose of 18.6 mJ/$cm^2$.

Example 9

Formation of Resist Pattern

The copolymer synthesized in the above-mentioned Example 3 was dissolved in ethyl lactate to prepare a 16% by weight solution. 5% by weight relative to the copolymer of triphenylsulfonium trifluoromethane sulfonate was added to the resulting ethyl lactate solution and completely dissolved. After filtering the resulting resist solution with a 0.2 μm Teflon™ membrane filter, it was spin coated onto a silicon substrate treated with HMDS at 3000 rpm and pre-baked for 60 seconds at 120° C. to obtain a resist film having a thickness of 0.7 μm. After exposing this resist film with a KrF excimer laser stepper (NA=0.45), it was baked for 60 seconds at 120° C., developed with a 2.38% aqueous solution of tetramethylammonium hydroxide (TMAH), and rinsed for 60 seconds with deionized water. The film was able to resolve a 0.30 μm line-and-space (L/S) pattern at an exposure dose of 16 mJ/$cm^2$.

Example 10

Formation of Resist Pattern

The copolymer synthesized in the above-mentioned Example 4 was dissolved in ethyl lactate to prepare a 16% by weight solution. 5% by weight relative to the copolymer of triphenylsulfonium trifluoromethane sulfonate was added to the resulting ethyl lactate solution and completely dissolved. After filtering the resulting resist solution with a 0.2 μm Teflon™ membrane filter, it was spin coated onto a silicon substrate treated with HMDS at 3000 rpm and pre-baked for 60 seconds at 120° C. to obtain a resist film having a thickness of 0.7 μm. After exposing this resist film with a KrF excimer laser stepper (NA=0.45), it was baked for 60 seconds at 120° C., developed with a 2.38% aqueous solution of tetramethylammonium hydroxide (TMAH), and rinsed for 60 seconds with deionized water. The film was able to resolve a 0.25 μm line-and-space (L/S) pattern at an exposure dose of 15 mJ/cm².

Example 11

Formation of Resist Pattern

The copolymer synthesized in the above-mentioned Example 5 was dissolved in ethyl lactate to prepare a 16% by weight solution. 5% by weight relative to the copolymer of triphenylsulfonium trifluoromethane sulfonate was added to the resulting ethyl lactate solution and completely dissolved. After filtering the resulting resist solution with a 0.2 μm Teflon™ membrane filter, it was spin coated onto a silicon substrate treated with HMDS at 3000 rpm and pre-baked for 60 seconds at 120° C. to obtain a resist film having a thickness of 0.7 μm. After exposing this resist film with a KrF excimer laser stepper (NA=0.45), it was baked for 60 seconds at 100° C., developed with a 2.38% aqueous solution of tetramethylammonium hydroxide (TMAH), and rinsed for 60 seconds with deionized water. The film was able to resolve a 0.25 μm line-and-space (L/S) pattern at an exposure dose of 18.2 mJ/cm².

Example 12

Formation of Resist Pattern

The copolymer synthesized in the above-mentioned Example 6 was dissolved in ethylethoxypropionate to prepare a 16% by weight solution. 5% by weight relative to the copolymer of diphenyliodonium trifluoromethane sulfonate was added to the resulting solution and completely dissolved. After filtering the resulting resist solution with a 0.2 μm Teflon™ membrane filter, it was spin coated onto a silicon substrate treated with HMDS at 3000 rpm and pre-baked for 60 seconds at 120° C. to obtain a resist film having a thickness of 0.7 μm. After exposing this resist film with a KrF excimer laser stepper (NA=0.45), it was baked for 90 seconds at 100° C., developed with a 2.38% aqueous solution of tetramethylammonium hydroxide (TMAH), and rinsed for 60 seconds with deionized water. The film was able to resolve a 0.25 μm line-and-space (L/S) pattern at an exposure dose of 16.2 mJ/cm².

Example 13

Formation of Resist Pattern

The copolymer synthesized in the above-mentioned Example 2 was dissolved in ethyl lactate to prepare an 18% by weight solution. 2% by weight relative to the copolymer of diphenyliodonium trifluoromethane sulfonate was added to the resulting ethyl lactate solution and completely dissolved. After filtering the resulting resist solution with a 0.2 μm Teflon™ membrane filter, it was spin coated onto a silicon substrate treated with HMDS at 3500 rpm and pre-baked for 60 seconds at 120° C. to obtain a resist film having a thickness of 0.5 μm. After exposing this resist film with an ArF excimer laser stepper (NA=0.55), it was baked for 60 seconds at 100° C., developed with a 2.38% aqueous solution of tetramethylammonium hydroxide (TMAH), and rinsed for 60 seconds with deionized water. The film was able to resolve a 0.18 μm line-and-space (L/S) pattern at an exposure dose of 6 mJ/cm².

Example 14

Formation of Resist Pattern

The copolymer synthesized in the above-mentioned Example 3 was dissolved in ethyl lactate to prepare a 16% by weight solution. 2% by weight relative to the copolymer of diphenyliodonium trifluoromethane sulfonate was added to the resulting ethyl lactate solution and completely dissolved. After filtering the resulting resist solution with a 0.2 μm Teflon™ membrane filter, it was spin coated onto a silicon substrate treated with HMDS at 3500 rpm and pre-baked for 60 seconds at 120° C. to obtain a resist film having a thickness of 0.5 μm. After exposing this resist film with an ArF excimer laser stepper (NA=0.55), it was baked for 60 seconds at 120° C., developed with a 2.38% aqueous solution of tetramethylammonium hydroxide (TMAH), and rinsed for 60 seconds with deionized water. The film was able to resolve a 0.20 μm line-and-space (L/S) pattern at an exposure dose of 7 mJ/cm².

Example 15

Formation of Resist Pattern

The copolymer synthesized in the above-mentioned Example 4 was dissolved in ethyl lactate to prepare an 18% by weight solution. 2% by weight relative to the copolymer of triphenylsulfonium trifluoromethane sulfonate was added to the resulting ethyl lactate solution and completely dissolved. After filtering the resulting resist solution with a 0.2 μm Teflon™ membrane filter, it was spin coated onto a silicon substrate treated with HMDS at 3500 rpm and pre-baked for 60 seconds at 120° C. to obtain a resist film having a thickness of 0.5 μm. After exposing this resist film with an ArF excimer laser stepper (NA=0.55), it was baked for 90 seconds at 100° C., developed with a 2.38% aqueous solution of tetramethylammonium hydroxide (TMAH), and rinsed for 60 seconds with deionized water. The film was able to resolve a 0.18 μm line-and-space (L/S) pattern at an exposure dose of 8 mJ/cm².

Example 16

Formation of Resist Pattern

The copolymer synthesized in the above-mentioned Example 5 was dissolved in ethyl lactate to prepare an 18% by weight solution. 2% by weight relative to the copolymer of triphenylsulfonium trifluoromethane sulfonate was added to the resulting ethyl lactate solution and completely dissolved. After filtering the resulting resist solution with a 0.2 μm Teflon™ membrane filter, it was spin coated onto a silicon substrate treated with HMDS at 3500 rpm and pre-baked for 60 seconds at 120° C. to obtain a resist film having a thickness of 0.5 μm. After exposing this resist film with an ArF excimer laser stepper (NA=0.55), it was baked for 90 seconds at 100° C., developed with a 2.38% aqueous solution of tetramethylammonium hydroxide (TMAH), and rinsed for 60 seconds with deionized water. The film was able to resolve a 0.18 μm line-and-space (L/S) pattern at an exposure dose of 7 mJ/cm².

Example 17

Formation of Resist Pattern

The copolymer synthesized in the above-mentioned Example 6 was dissolved in ethyl lactate to prepare a 16% by weight solution. 2% by weight relative to the copolymer of triphenylsulfonium trifluoromethane sulfonate was added to the resulting ethyl lactate solution and completely dissolved. After filtering the resulting resist solution with a 0.2 μm Teflon™ membrane filter, it was spin coated onto a silicon substrate treated with HMDS at 3500 rpm and pre-baked for 60 seconds at 120° C. to obtain a resist film having a thickness of 0.5 µm. After exposing this resist film with an ArF excimer laser stepper (NA=0.55), it was baked for 60 seconds at 120° C., developed with a 2.38% aqueous solution of tetramethylammonium hydroxide (TMAH), and rinsed for 60 seconds with deionized water. The film was able to resolve a 0.17 µm line-and-space (L/S) pattern at an exposure dose of 7 mJ/cm$^2$.

Example 18

Evaluation of Dry-Etch Resistance

The procedure described in the above-mentioned Example 7 was repeated using the copolymers prepared in the above-mentioned Examples 1 through 6. Next, in order to evaluate the resistance to dry etching of the formulated resist films, the silicon substrates were put in a parallel plate reactive ion etcher followed by carbon tetrafluoride ($CF_4$) etching at Pµ=200 W, pressure=0.02 Torr, $CF_4$ gas=100 sccm and operation time of 5 minutes. For comparison, similar evaluations were performed on Nagase Positive Resist NPR-820 (Nagase Industries, Ltd.) and polymethylmethacrylate (PMMA), which are both commercially available resists. The results obtained are shown in Table 1 below.

TABLE 1

| Type of Resist | Etching Rate (Å/min) | Rate Ratio (vs. NPR) |
| --- | --- | --- |
| NPR-820 | 523 | 1.00 |
| PMMA | 790 | 1.51 |
| Example 1 (Present Invention) | 580 | 1.11 |
| Example 2 (Present Invention) | 780 | 1.49 |
| Example 3 (Present Invention) | 600 | 1.15 |
| Example 4 (Present Invention) | 770 | 1.47 |
| Example 5 (Present Invention) | 748 | 1.43 |
| Example 6 (Present Invention) | 680 | 1.30 |

As can be understood from the above results, the etching resistance of a resist composition according to the present invention is comparable to that of NPR-820 and far superior to PMMA provided it has a resin structure that contains a phenol ring or alicyclic group.

Example 19

Synthesis of 2-methyl-2-bicyclo[2,2,2]octanemethacrylate/propylenecarbonatemethacrylate copolymer 6.12 g (29.4 millimoles) of 2-methyl-2-bicyclo[2,2,2]octanemethacrylate, 4.17 g (29.4 millimoles) of glycidylmethacrylate, a Teflon™-coated stirring bar, 19.6 ml of dioxane and 1.45 g (8.8 millimoles) of azobisisobutyronitrile (AIBN) were added to a 100 ml eggplant type flask and stirred for 8 hours at 70° C. in a nitrogen atmosphere. After diluting the reaction solution with tetrahydrofuran (THF), it was dropped into 1.5 liters of methanol containing a small amount of hydroquinone. The resulted precipitate was filtered off with a glass filter and dried for 16 hours at 0.1 mmHg and 45° C. The resulted white powder was again dissolved in THF and the above-mentioned precipitation and drying procedure was repeated twice to obtain a white resin powder.

Next, the resulted white resin powder was placed in a 100 ml three-necked flask. After placing a Teflon™-coated stirring bar in the flask and attaching a Dimroth condenser and carbon dioxide feed tube, the powder was dissolved in 100 ml of NMP. The mixture was stirred for 3 hours at 100° C. while introducing carbon dioxide by vaporizing dry ice. The reaction mixture was dropped into 1.5 liters of methanol. The resulted precipitate was filtered off with a glass filter and dried for 16 hours at 0.1 mmHg and 45° C. The resulted white powder was again dissolved in THF, and the above-mentioned precipitation and drying procedure was repeated twice to obtain a white resin powder. When the composition of this white powder was examined by $^1$H-NMR, the ratio of bicyclooctane to carbonate in the copolymer was determined to be 52:48. The transmittances of this copolymer at wavelengths of 248 and 193 nm were 96% and 65%, respectively (film thickness: 1 µm, on a quartz substrate), thus indicating excellent transparency. In addition, other analysis results were as shown below.

Yield: 7.3 g (71%)

Weight average molecular weight: 14200 (based on standard polystyrene)

Degree of dispersion: 1.88

IR (KRS-5, cm$^{-1}$): 1813, 1723, 1259, 1162, 1102

Example 20

Formation of Resist Pattern

The copolymer synthesized in the above-mentioned Example 19 was dissolved in propyleneglycol methylether acetate to prepare a 19% by weight solution. Furthermore, this copolymer solution also contained 8% by weight of γ-butyrolactone as an auxiliary solvent. 5% by weight relative to the copolymer of triphenylsulfonium trifluoromethane sulfonate was added to the resulting solution and completely dissolved. After filtering the resulting resist solution with a 0.2 µm Teflon™ membrane filter, it was spin coated onto, a silicon substrate treated with HMDS at 3000 rpm and pre-baked for 60 seconds at 120° C. to obtain a resist film having a thickness of 0.7 µm. After exposing this resist film with a KrF excimer laser stepper (NA=0.45), it was baked for 60 seconds at 100° C., developed with a 2.38% aqueous solution of tetramethylammonium hydroxide (TMAH), and rinsed for 60 seconds with deionized water. The film was able to resolve a 0.25 µm line-and-space (L/S) pattern at an exposure dose of 18 mJ/cm$^2$.

Example 21

Formation of Resist Pattern

The copolymer synthesized in the above-mentioned Example 19 was dissolved in ethyl lactate to prepare an 18% by weight solution. 5% by weight relative to the copolymer of triphenylsulfonium trifluoromethane sulfonate was added to the resulting ethyl lactate solution and completely dissolved. After filtering the resulting resist solution with a 0.2 µm Teflon™ membrane filter, it was spin coated onto a silicon substrate treated with HMDS at 3500 rpm and pre-baked for 60 seconds at 120° C. to obtain a resist film having a thickness of 0.5 µm. After exposing this resist film with an ArF excimer laser stepper (NA=0.55), it was baked for 60 seconds at 100° C., developed with a 2.38% aqueous solution of tetramethylammonium hydroxide (TMAH), and rinsed for 60 seconds with deionized water. The film was able to resolve a 0.18 µm line-and-space (L/S) pattern at an exposure dose of 7.4 mJ/cm$^2$.

Example 22

Evaluation of Dry-Etch Resistance

The procedure described in the above-mentioned Example 20 was repeated using the copolymer prepared in the above-mentioned Example 19. Next, in order to evaluate the resistance to dry etching of the formulated resist films, the silicon substrates were put in a parallel plate reactive ion etcher followed by carbon tetrafluoride ($CF_4$) etching at $P\mu$=200 W, pressure=0.02 Torr, $CF_4$ gas=100 sccm and operation time of 5 minutes. For comparison, similar evaluations were performed on Nagase Positive Resist NPR-820 (Nagase Industries, Ltd.) and polymethylmethacrylate (PMMA), which are both commercially available resists. The results obtained are shown in Table 2 below.

TABLE 2

| Type of Resist | Etching Rate (Å/min) | Rate Ratio (vs. NPR) |
|---|---|---|
| NPR-820 | 523 | 1.00 |
| PMMA | 790 | 1.51 |
| Example 19 (Present Invention) | 664 | 1.27 |

As can be understood from the above results, the etching resistance of a resist composition according to the present invention is comparable to that of NPR-820 and far superior to PMMA.

Example 23

Evaluation of Resolution of Resist Film

The 2-methyl-2-adamantylmethacrylate/propylenecarbonatemethacrylate copolymer synthesized in the above-mentioned Example 3 was dissolved in ethyl lactate to prepare an 18% by weight solution. 2% by weight relative to the copolymer of triphenylsulfonium trifluoromethane sulfonate was added to the resulting ethyl lactate solution and completely dissolved. After filtering the resulting resist solution with a 0.2 $\mu$m Teflon™ membrane filter, it was spin coated onto a silicon substrate treated with HMDS at 4000 rpm and pre-baked for 60 seconds at 120° C. to obtain a resist film having a thickness of 0.5 $\mu$m. After exposing this resist film with an ArF excimer laser stepper (NA=0.55), it was baked for 60 seconds at 100° C., developed with a 2.38% aqueous solution of tetramethylammonium hydroxide (TMAH), and rinsed for 60 seconds with deionized water. The film was able to resolve a 0.25 $\mu$m line-and-space (L/S) pattern at an exposure value of 16 mJ/cm$^2$. In addition, the resist pattern was strongly adhered to the substrate and did not peel off from the substrate during rinsing.

Next, for the sake of comparison, the above-mentioned procedure was repeated using 2-methyl-2-adamantylmethacrylate/methylmethacrylate copolymer (copolymer ratio=51:49, weight average molecular weight= 18500 (based on standard polystyrene and degree of dispersion=1.88) instead of the above-mentioned copolymer. When rinsed with deionized water, resist patterns having a width of 0.35 $\mu$m or less separated from the substrate and could not be resolved. This indicates that the use of propylenecarbonate for one of the monomer units as in the present invention allows high resolution to be easily obtained.

Example 24

Manufacturing of MOS Transistor

A gate oxide film was formed on the surface of a silicon substrate and a Poli-Si (polysilicon) film was further formed on this gate oxide film by CVD followed by lowering the resistance by injecting n-type impurities such as phosphorous. A WSi film was then formed by sputtering. Next, a 0.30 $\mu$m L&S resist pattern was formed on this uppermost WSi film in accordance with the procedure described in the above-mentioned Example 9. Anisotropic etching was then performed on the WSi film and polysilicon film underneath using the resulting resist pattern as a mask to form a gate electrode comprising a polysilicon film and WSi film.

After forming the gate electrode, ions were injected by ion implantation to form a N$^-$ diffusion layer having an LDD structure. Next, after removing the resist film on the gate electrode, an oxide film was formed over the entire surface by CVD. Moreover, anisotropic etching was performed on the resulting CVD oxide film to form a sidewall in the side wall portion of the gate electrode comprising a polysilicon film and WSi film. Next, ion implantation was performed using the WSi film and sidewall as masks to form an N$^+$ diffusion layer. Continuing, in order to activate this layer, the silicon substrate was heat treated in a nitrogen atmosphere followed by further heating in an oxygen atmosphere to form a thermal oxide film covering the gate oxide film.

After forming an interlayer insulating film on the uppermost layer of the substrate by CVD, the resist solution was again coated according to the procedure described in the above-mentioned Example 14 to perform selective etching and form a hyperfine hole pattern of 0.2 $\mu$m in the wire forming portion. Furthermore, in this resist process, an ArF excimer laser exposure device (NA=0.55) was used instead of a KrF excimer laser stepper (NA=0.45). Moreover, a contact hole was formed by performing anisotropic etching on the interlayer insulating film underneath using this resist pattern as a mask. Finally, aluminum (Al) wiring was embedded in the contact hole to complete an N channel, hyperfine MOS transistor.

In this example, an example of the manufacturing of a semiconductor device was explained with reference to an MOS transistor. Further, the pattern formation of a mask substrate, reticle and so forth as well as the manufacturing of other devices can also be carried out advantageously by applying the present invention. Furthermore, the present invention can be advantageously applied to the patterning process on the glass and other substrates used in the LCD and other display devices.

We claim:

1. A resist composition that can be developed with a basic aqueous solution comprising: the combination of a base resin comprised of a polymer that is itself insoluble in a basic aqueous solution and contains within its structure at least (A) a monomer unit I having a carboxylic acid or phenol protected with a protective group capable of being deprotected with an acid selected from the group consisting of an ester group, ether group, acetal group and ketal group, and (B) a monomer unit II having an ester group or ether group that contains a cyclic carbonate structure, and that can become soluble in a basic aqueous solution when the protective group of said monomer unit I is deprotected by the effect of the acid; and, a photo acid generator capable of generating an acid that can provoke deprotection of said protective group of monomer unit I when decomposed by absorption of imaging radiation.

2. A resist composition as set forth in claim 1 wherein said monomer unit I having a protected carboxylic acid is composed of a (meth)acrylate monomer unit.

3. A resist composition as set forth in claim 1 wherein said monomer unit I having a protected phenol is composed of a vinylphenol monomer unit.

4. A resist composition as set forth in any of claims 1 through 3 wherein the ester group that is a protective group of said monomer unit I is an alicyclic hydrocarbon group.

5. A resist composition as set forth in claim 4 wherein said alicyclic hydrocarbon group has a tertiary alcohol structure and is ester-bonded with that tertiary alcohol.

6. A resist composition as set forth in claim 4 wherein said alicyclic hydrocarbon group has a polycyclic alicyclic backbone.

7. A resist composition as set forth in any of claims 1 through 3 wherein said monomer unit II having an ester group or ether group that contains a cyclic carbonate structure is composed of a (meth)acrylate monomer unit.

8. A resist composition as set forth in any of claims 1 through 3 wherein said polymer does not have conjugated double bonds in its structure.

9. A resist composition as set forth in any of claims 1 through 3 wherein said photo acid generator is contained in an amount of 0.1–50% by weight based on the total amount of said base resin.

10. A resist composition as set forth in any of claims 1 through 3 wherein, when a film having a thickness of 1 μm is formed on a quartz substrate, the transmittance at the wavelength at which it is exposed is at least 20%.

11. A resist composition as set forth in any of claims 1 through 3 in the form of a solution formed by dissolving said composition in a solvent selected from the group consisting of ethyl lactate, methylamyl ketone, methyl-3-methoxypropionate, ethyl-3-ethoxypropionate, propyleneglycol methyletheracetate and their mixtures.

12. A resist composition as set forth in claim 11 that further contains an auxiliary solvent selected from the group consisting of butyl acetate, γ-butyrolactone, propyleneglycol methylether and their mixtures.

13. A process for forming a resist pattern comprising the steps of:

coating a resist composition comprising: the combination of a base resin comprised of a polymer that is itself insoluble in a basic aqueous solution and contains within its structure at least (A) a monomer unit I having carboxylic acid or phenol protected with a protective group capable of being deprotected with an acid selected from the group consisting of an ester group, ether group, acetal group and ketal group, and (B) a monomer unit II having an ester group or ether group that contains a cyclic carbonate structure, and that can become soluble in a basic aqueous solution when the protective group of said monomer unit I is deprotected by the effect of the acid; and, a photo acid generator capable of generating an acid that can provoke deprotection of said protective group of monomer unit I when decomposed by absorption of imaging radiation; on a treated substrate, selectively exposing the formed resist film to imaging radiation which is able to provoke decomposition of said photo acid generator of the resist composition, and developing the exposed resist film with a basic aqueous solution.

14. A process for forming a resist pattern as set forth in claim 13 wherein a KrF or ArF excimer laser is used for the exposure light source in said exposure step.

15. A process for manufacturing a semiconductor device comprising the steps of:

forming a resist film by coating a resist composition comprising: the combination of a base resin comprised of a polymer that is itself insoluble in a basic aqueous solution and contains within its structure at least (A) a monomer unit I having carboxylic acid or phenol protected with a protective group capable of being deprotected with an acid selected from the group consisting of an ester group, ether group, acetal group and ketal group, and (B) a monomer unit II having an ester group or ether group that contains a cyclic carbonate structure, and that can become soluble in a basic aqueous solution when the protective group of said monomer unit I is deprotected by the effect of the acid; and, a photo acid generator capable of generating an acid that can provoke deprotection of said protective group of monomer unit I when decomposed by absorption of imaging radiation; on a substrate to be treated, selectively exposing said resist film with imaging radiation which is able to provoke decomposition of said photo acid generator of the resist composition, forming a resist pattern by developing the exposed resist film with a basic aqueous solution, and, using said resist pattern as a mask, etching said underlying substrate.

16. A process for manufacturing a semiconductor device as set forth in claim 15 wherein said substrate has a layer to be etched applied thereon.

17. A process for manufacturing a semiconductor device as set forth in claim 15 or 16 wherein a KrF or ArF excimer laser is used for the exposure light source in said exposure step.

* * * * *